(12) United States Patent
Rofougaran et al.

(10) Patent No.: US 8,498,586 B2
(45) Date of Patent: *Jul. 30, 2013

(54) ON-PACKAGE TRANSMIT/RECEIVE SWITCH AND ANTENNA

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 3 days.

This patent is subject to a terminal disclaimer.

(21) Appl. No.: 13/565,629

(22) Filed: Aug. 2, 2012

(65) Prior Publication Data
US 2012/0294208 A1 Nov. 22, 2012

Related U.S. Application Data

(63) Continuation of application No. 12/397,024, filed on Mar. 3, 2009, now Pat. No. 8,238,842.

(51) Int. Cl.
*H04B 1/44* (2006.01)

(52) U.S. Cl.
USPC .............................................. 455/78; 343/860

(58) Field of Classification Search
USPC ................................... 343/850, 860; 455/78
See application file for complete search history.

(56) References Cited

U.S. PATENT DOCUMENTS

| 7,212,788 | B2 * | 5/2007 | Weber et al. | 455/78 |
|---|---|---|---|---|
| 7,233,773 | B2 * | 6/2007 | Hansen et al. | 455/69 |
| 7,348,842 | B2 * | 3/2008 | Ichitsubo et al. | 330/66 |
| 7,450,072 | B2 * | 11/2008 | Kim et al. | 343/700 MS |
| 7,671,804 | B2 * | 3/2010 | Zhang et al. | 343/700 MS |
| 7,865,149 | B2 * | 1/2011 | Han et al. | 455/73 |
| 2005/0079847 | A1 * | 4/2005 | Arafa | 455/272 |
| 2005/0281354 | A1 * | 12/2005 | Kim | 375/299 |
| 2008/0159364 | A1 * | 7/2008 | Rofougaran | 375/219 |
| 2008/0299930 | A1 * | 12/2008 | Rofougaran et al. | 455/275 |
| 2010/0080204 | A1 * | 4/2010 | Yen et al. | 370/338 |
| 2010/0157858 | A1 * | 6/2010 | Lee et al. | 370/297 |
| 2010/0171661 | A1 * | 7/2010 | Rofougaran | 342/372 |
| 2010/0238075 | A1 * | 9/2010 | Pourseyed | 343/702 |
| 2011/0105061 | A1 * | 5/2011 | Yu et al. | 455/127.2 |
| 2011/0150050 | A1 * | 6/2011 | Trigui et al. | 375/219 |
| 2011/0158081 | A1 * | 6/2011 | Wang et al. | 370/201 |
| 2011/0159823 | A1 * | 6/2011 | Lo et al. | 455/78 |
| 2011/0199278 | A1 * | 8/2011 | Rofougaran | 343/856 |
| 2011/0201283 | A1 * | 8/2011 | Lorenz et al. | 455/78 |
| 2011/0221643 | A1 * | 9/2011 | Rofougaran | 343/750 |
| 2011/0248901 | A1 * | 10/2011 | Alexopoulos et al. | 343/836 |
| 2011/0250838 | A1 * | 10/2011 | Alexopoulos et al. | 455/41.1 |

* cited by examiner

*Primary Examiner* — William Hernandez
(74) *Attorney, Agent, or Firm* — Farjami & Farjami LLP

(57) ABSTRACT

Methods and systems for an on-chip and/or on-package T/R switch and antenna are disclosed and may include selectively coupling one or more low noise amplifiers (LNAs) and/or one or more power amplifiers (PAs) to one or more ports of a multi-port distributed antenna utilizing configurable transmit/receive (T/R) switches integrated on a chip with the LNAs and PAs. The LNAs and PAs may be impedance matched to the antenna by coupling them to a port based on a characteristic impedance at the port. The T/R switches may be integrated on a package to which the chip may be coupled. The signals transmitted and received by the antenna may be time division duplexed. The antenna, which may include a microstrip antenna, may be integrated on the chip or the package. The LNA and the PA may be coupled to different ports on the antenna via the T/R switches.

14 Claims, 5 Drawing Sheets

ON-PACKAGE TRANSMIT/RECEIVE SWITCH AND ANTENNA

This is a continuation of application Ser. No. 12/397,024 filed Mar. 3, 2009 now U.S. Pat. No. 8,238,824.

CROSS-REFERENCE TO RELATED APPLICATIONS/INCORPORATION BY REFERENCE

This application makes reference to: U.S. patent application Ser. No. 12/367,892 filed on Feb. 9, 2009; U.S. patent application Ser. No. 12/396,935 filed on Mar. 3, 2009; U.S. patent application Ser. No. 12/396,964 filed on Mar. 3, 2009; U.S. patent application Ser. No. 12/397,005 filed on Mar. 3, 2009; U.S. patent application Ser. No. 12/397,040 filed on Mar. 3, 2009; U.S. patent application Ser. No. 12/397,060 filed on Mar. 3, 2009; and U.S. patent application Ser. No. 12/397,096 filed on Mar. 3, 2009.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for an on-chip and/or on-package transmit/receive (T/R) switch and antenna.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for an on-chip and/or on-package transmit/receive switch and antenna, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for an on-chip and/or on-package transmit/receive (T/R) switch and antenna. Exemplary aspects of the invention may comprise configuring one or more T/R switches, which may be integrated on a chip with a plurality of low noise amplifiers (LNAs) and a plurality of power amplifiers (PAs), to selectively couple one or more of the plurality of LNAs and/or one or more of the plurality of PAs to one or more of a plurality of ports of a multi-port distributed antenna. The selectively coupled plurality of LNAs and PAs may be impedance matched to the multi-port distributed antenna by coupling the one or more of the plurality of LNAs and PAs to the one or more of a plurality of ports based on a characteristic impedance of the multi-port distributed antenna at the one of a plurality of ports. The T/R switch, which may comprise CMOS switches, may be integrated on a package, where the chip may be bonded to the package. The signals, which may comprise RF signals, transmitted and received by the multi-port distributed antenna may be time division duplexed. The multi-port distributed antenna may be integrated on a chip with the LNAs and PAs, or integrated on a package to which the chip is bonded. The multi-port distributed antenna may comprise a microstrip antenna. The one of the plurality of LNAs and the one of the plurality of PAs may be coupled to different ports on the multi-port distributed antenna via the T/R switch.

Figure 1:
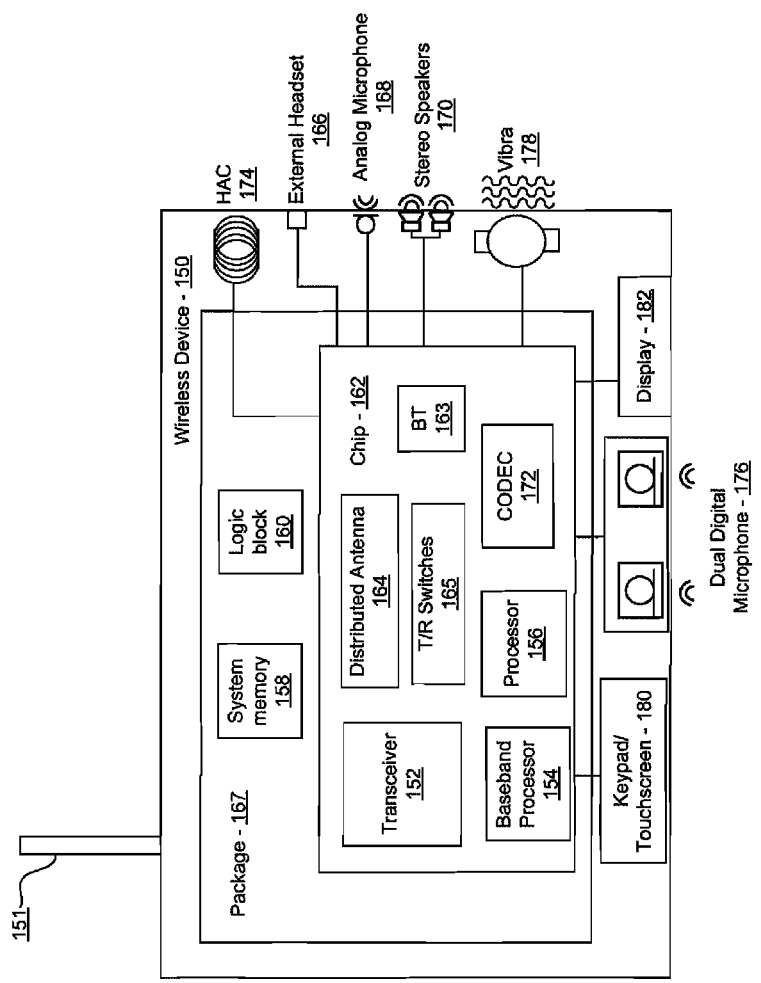
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, a distributed antenna 164, transmit/receive (T/R) switches 165, an external headset port 166, and a package 167. The wireless device 150 may also comprise an analog microphone 168, integrated hands-free (IHF) stereo speakers 170, a hearing aid compatible (HAC) coil 174, a dual digital microphone 176, a vibration transducer 178, a keypad and/or touchscreen 180, and a display 182.

The transceiver 152 may comprise suitable logic, circuitry, interface(s), and/or code that may be enabled to modulate and upconvert baseband signals to RF signals for transmission by one or more antennas, which may be represented generically by the antenna 151. The transceiver 152 may also be enabled to downconvert and demodulate received RE signals to baseband signals. The RF signals may be received by one or more antennas, which may be represented generically by the antenna 151, or the distributed antenna 164. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, 3GPP, UMTS, BLUETOOTH, and ZIGBEE, for example.

The baseband processor 154 may comprise suitable logic, circuitry, interface(s), and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interface(s), and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interface(s), and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interface(s), and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example The CODEC 172 may comprise suitable circuitry, logic, interface(s), and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The CODEC 172 may utilize a programmable infinite impulse response (IIR) filter and/or a programmable finite impulse response (FIR) filter for at least a portion of the audio sources to compensate for passband amplitude and phase fluctuation for different output devices. In this regard, filter coefficients may be configured or programmed dynamically based on current operations. Moreover, the filter coefficients may be switched in one-shot or may be switched sequentially, for example. The CODEC 172 may also utilize a modulator, such as a Delta-Sigma (Δ-Σ) modulator, for example, to code digital output signals for analog processing.

The chip 162 may comprise an integrated circuit with multiple functional blocks integrated within, such as the transceiver 152, the processor 156, the baseband processor 154, the BT radio/processor 163, the T/R switches 165, the CODEC 172, and the distributed antenna 164. The number of functional blocks integrated in the chip 162 is not limited to the number shown in FIG. 1. Accordingly, any number of blocks may be integrated on the chip 162 depending on chip space and wireless device 150 requirements, for example.

The distributed antenna 164 may comprise a plurality of ports for coupling signals in and/or out of the distributed antenna 164, and may be integrated in and/or on the chip 162. The physical dimensions of the distributed antenna 164 may be configured to optimize a frequency of operation and/or characteristic impedance at the plurality of ports. In another embodiment of the invention, the distributed antenna 164 may be integrated on a package to which the chip 162 may be affixed. In this manner, the dimensions of the distributed antenna 164 may not be limited by the size of the chip 162.

The T/R switches 165 may comprise suitable circuitry, logic, interface(s), and/or code that may be operable to switch multiple components in the transceiver 152 to ports on the distributed antenna 164. The T/R switches 165 may comprise a plurality of switches that may enable the coupling of multiple devices to a single port on the distributed antenna 164. For example, an LNA and a PA in the transceiver 152 may share a single port in the distributed antenna 164, and may be operated in time division duplex (TDD) mode utilizing the T/R switches 165, which may alternate between coupling the LNA and the PA to a port on the distributed antenna 164. The port may be selected based on impedance matching between the port and the output impedance of the PA and input impedance of the LNA, for example. The T/R switches 165 may comprise a plurality of CMOS switches, for example, that may be enabled by the processor 156 or other control circuitry in the wireless device 150.

The external headset port 166 may comprise a physical connection for an external headset to be communicatively coupled to the wireless device 150. The analog microphone 168 may comprise suitable circuitry, logic, interface(s), and/or code that may detect sound waves and convert them to electrical signals via a piezoelectric effect, for example. The electrical signals generated by the analog microphone 168 may comprise analog signals that may require analog to digital conversion before processing.

The package 167 may comprise a printed circuit board or other support structure for the chip 162 and other components of the wireless device 150. In this regard, the chip 162 may be bonded to the package 167. The package 167 may comprise insulating and conductive material, for example, and may provide isolation between electrical components mounted on the package 167.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, interface(s), and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, interface(s), and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

The wireless signals may be transmitted and received by the distributed antenna 164 which may comprise a plurality of input/output ports. The characteristic impedance seen by a device coupled to a particular port may be configured by the physical dimensions and by which of the plurality of ports the device may be coupled to, for example. In various embodiments of the invention, power amplifiers and/or low noise amplifiers with similar impedances may be coupled to the same port on the distributed antenna 164. This may be accomplished with the T/R switches 165, which may couple an LNA and a PA to the same port on the distributed antenna 164, but at alternate times, thus operating in TDD mode. Sharing ports on the distributed antenna 164 for both transmission and reception of signals may reduce space requirements on the chip 162. In another embodiment of the invention, the distributed antenna may be integrated on the package 167, reducing space requirements of the chip 162 and improving space utilization in the wireless device 150.

Figure 2:
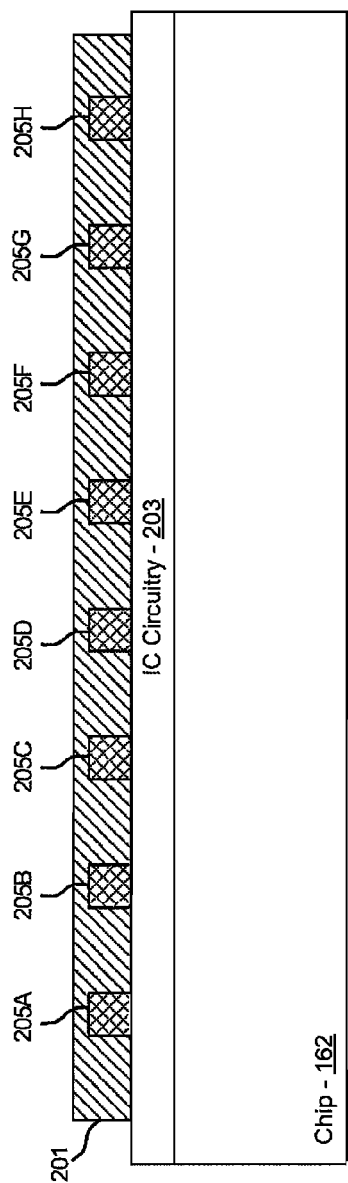
FIG. 2 is a block diagram illustrating an exemplary multi-port distributed antenna on a chip, in accordance with an embodiment of the invention.

FIG. 2 is a block diagram illustrating an exemplary multi-port distributed antenna on a chip, in accordance with an embodiment of the invention. Referring to FIG. 2, there is shown the chip 162, a distributed antenna 201, IC circuitry 203, and antenna ports 205A-205H. The chip 162 may be as described with respect to FIG. 1. The IC circuitry 203 may comprise devices integrated in the chip 162, such as the transceiver 152, the processor 156, the T/R switches 165, and the baseband processor 154, for example.

The distributed antenna 201, which may be substantially similar to the distributed antenna 164 described with respect to FIG. 1, may comprise an antenna integrated in and/or on the chip 162 that may comprise a plurality of ports, the antenna ports 205A-205H, such that driver and receiver circuitry may be coupled to appropriate points along the distributed antenna 201. For example, LNAs may be coupled to ports that exhibit high characteristic impedance, and PAs may be coupled to ports that exhibit low characteristic impedance. The distributed antenna 201 may comprise a microstrip or coplanar waveguide, for example.

The antenna ports 205A-205H may comprise electrical contacts along the length of the distributed antenna 201 that may enable coupling to the antenna at a plurality of points. In this manner, devices may be coupled to the distributed antenna 201 where the characteristic impedance may be matched to the desirable impedance for the device to be coupled. The antenna ports 205A-205H may comprise metal strips, for example, that may be electrically coupled to the distributed antenna 201. In an embodiment of the invention, the antenna ports 205A-205H may be coupled to T/R switches such as the T/R switches 165, described with respect to FIG. 1.

In operation, a plurality of PAs and LNAs may be coupled to the antenna ports 205A-205H via a T/R switch comprising an array of switches to allow multiple devices to be coupled to a single antenna port 205A-205H. The impedance of the devices to be coupled may be matched to the characteristic impedance of the port to be coupled to such that the efficiency of the transmission of signals is maximized. This may, for example, increase the efficiency and thus the battery life of the wireless device 150.

Figure 3A:
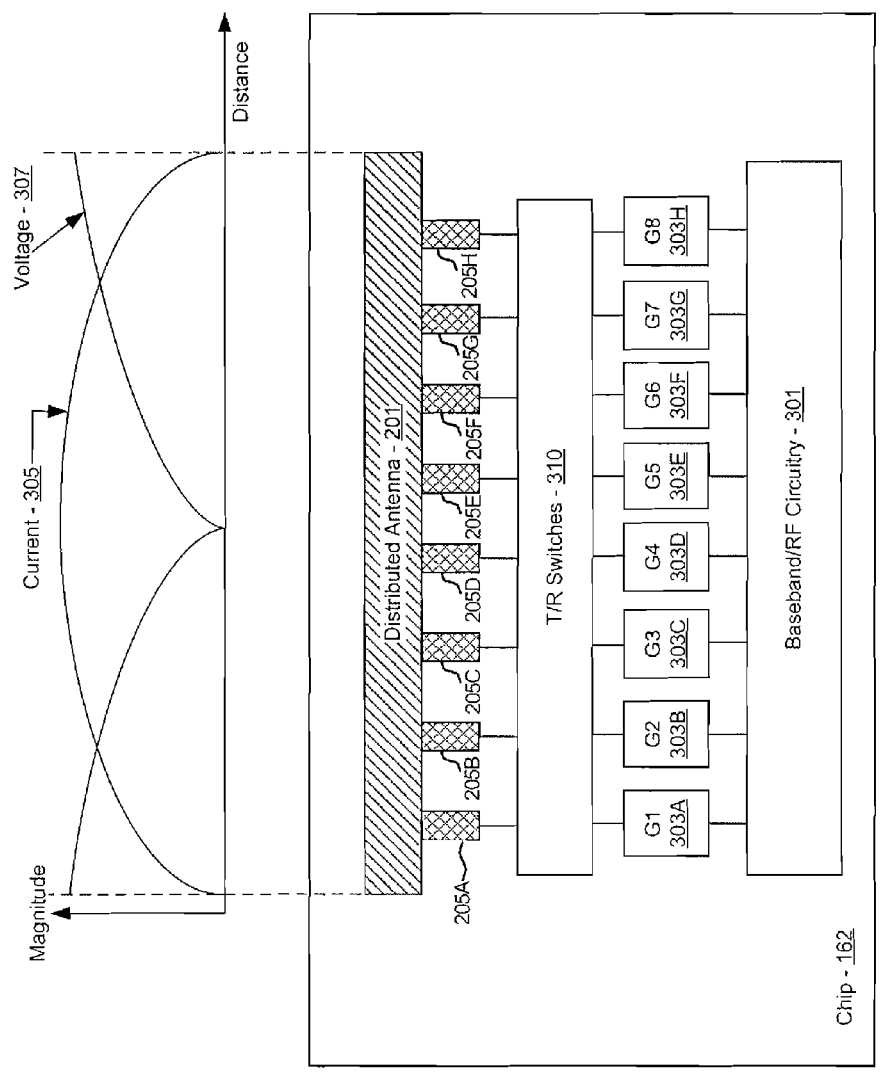
FIG. 3A is a block diagram illustrating a plan view of exemplary transmit/receive switches and a multi-port distributed antenna on a chip, in accordance with an embodiment of the invention.

FIG. 3A is a block diagram illustrating a plan view of exemplary transmit/receive switches and a multi-port distributed antenna on a chip, in accordance with an embodiment of the invention. Referring to FIG. 3A, there is shown the chip 162, the distributed antenna 201, the antenna ports 205A-205H, baseband/RF circuitry 301, amplifiers 303A-303H, and T/R switches 310.

The baseband/RF circuitry 301 may comprise suitable, circuitry, logic, interface(s), and/or code that may be operable to process baseband and RF signals. The baseband/RF circuitry 301 may comprise the transceiver 152, the baseband processor 154, the processor 156, the CODEC 172, and the BT radio/processor 163, for example, described with respect to FIG. 1. Accordingly, the baseband/RF circuitry 301 may generate signals to be communicated to one or more of the amplifiers 303A-303H, and may receive signals generated by one or more of the amplifiers 303A-303H.

The amplifiers 303A-303H may comprise suitable, circuitry, logic, interface(s), and/or code that may be operable to amplify received signals, and may comprise power amplifiers (PAs) and/or low noise amplifiers (LNAs) that may be operable to communicate signals to and from the wireless medium via the distributed antenna 201.

The T/R switches 310 may be substantially similar to the T/R switches 165 and may be operable to switch one or more of the amplifiers 303A-303H to one of the antenna ports 205A-205H, or vice versa. Accordingly, the amplifiers 303A-303H may be switched to one or more of the antenna ports 205A-205H.

The current versus distance plot 305 may represent the magnitude of current across the length of the distributed antenna 201. Similarly, the voltage versus distance plot 307 may represent the magnitude of voltage across the length of the distributed antenna 201. The current and voltage at a given point on a distributed antenna may be dependant on the frequency of signals to be transmitted and/or received, the conductivity of the metal and the dielectric constant between the antenna and a ground plane, and by the physical dimensions of the antenna. Accordingly, by providing a plurality of antenna ports 205A-205H along the length of the distributed antenna 201, a plurality of characteristic impedances may be available for matching to the amplifiers 303A-303H.

The number of antenna ports 205A-105H is not limited to the number shown in FIGS. 2 and 3A. Accordingly, any number of ports and amplifiers may be utilized depending on the desired number of characteristic impedances and range of amplifier gain or power.

In operation, RF signals may be generated by the baseband/RF circuitry 301. For a PA that may transmit maximum power with a low impedance antenna, the antenna port 205D may be utilized, where a high current/low voltage point along the distributed antenna 201 may be located. Similarly, the distributed antenna may be configured to receive RF signals and may communicate the received signals to an LNA, the amplifier 303A, for example, which may generate a maximum signal from a high impedance antenna, via the antenna port 205A, which may represent a high impedance port as indicated by the high voltage and low current for the current versus distance plot 305 and the voltage versus distance plot 307. However, when the received signals and the signals to be transmitted require an LNA and a PA, respectively, that exhibit similar impedances, a single antenna port of the antenna ports 205A-205H may be utilized by both the LNA and the PA.

A plurality of antenna ports along the distributed antenna 201 may enable impedance matching of the amplifiers 303A-303H to respective portions of the distributed antenna 201, such that high impedance devices/circuits may be coupled to high impedance ports of the antenna ports 205A-205H, and low impedance devices/circuits may be coupled to low impedance ports of the antenna ports 205A-205H. In this manner, impedance matching may be enabled without adding extra impedance matching circuitry, which may utilize excessive space or components. The baseband/RF circuitry 301 may be enabled to operate in time division duplex (TDD) mode so that the distributed antenna 201 may be utilized for both transmission and reception of RF signals utilizing the T/R switches 310.

In an embodiment of the invention, the gain and/or output power of the amplifiers 303A-303H may be dynamically configured to adjust to changing conditions such as received signal strength or channel conditions, for example. In addition, the T/R switches 310 may decouple one of the amplifiers 303A-303H and couple another one to increase/decrease gain and/or output power as needed.

Figure 3B:
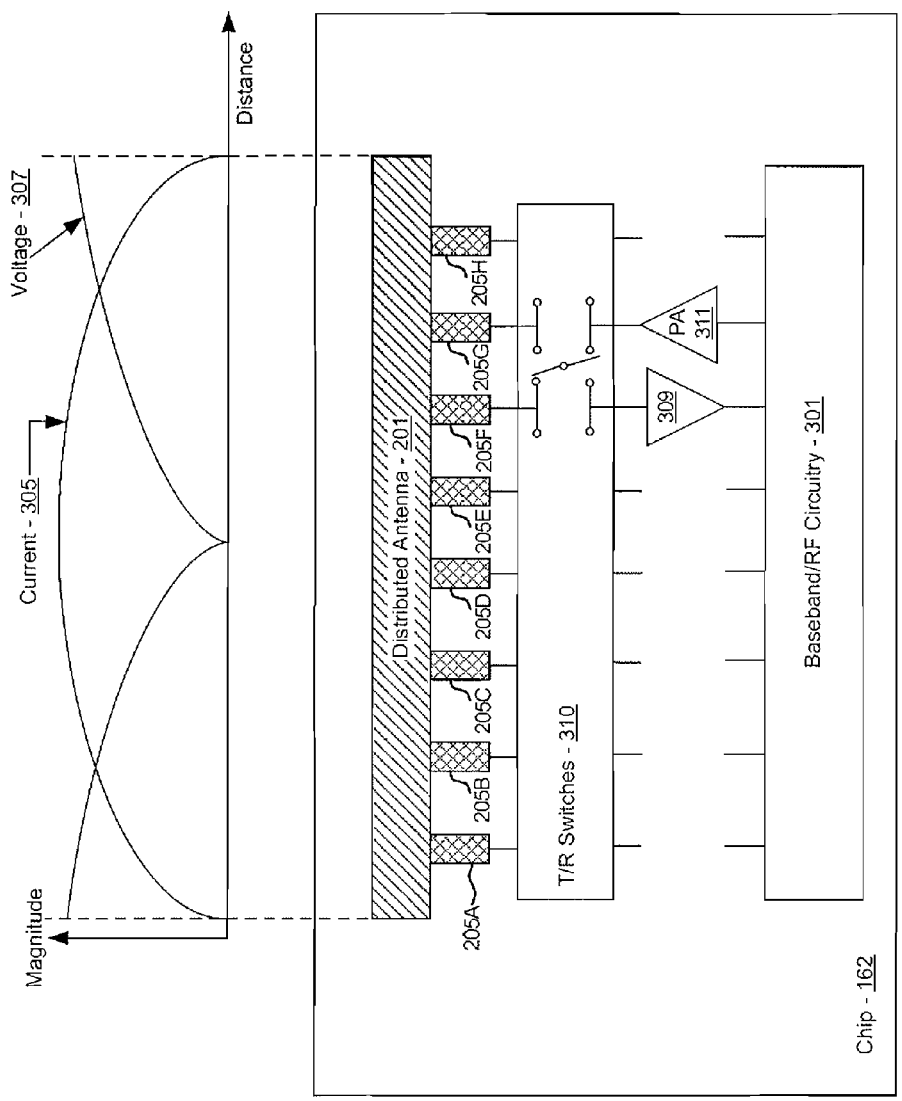
FIG. 3B is a block diagram illustrating a plan view of an exemplary transmit/receive switch and a multi-port distributed antenna on a chip in TDD mode, in accordance with an embodiment of the invention

FIG. 3B is a block diagram illustrating a plan view of an exemplary transmit/receive switch and a multi-port distributed antenna on a chip in TDD mode, in accordance with an embodiment of the invention. Referring to FIG. 3B, there is shown the chip 162, the distributed antenna 201, the antenna ports 205A-205H, baseband/RF circuitry 301, an LNA 309, a PA 311, and the T/R switches 310. The chip 162, the distributed antenna 201, the antenna ports 205A-205H, the baseband/RF circuitry 301, and the T/R switches 310 may be as described with respect to FIGS. 1, 2, and 3A.

The LNA 309 may comprise suitable circuitry, logic, interface(s), and/or code that may be operable to amplify signals received by the distributed antenna 201 and communicated via the T/R switches 310 to the LNA 309. The PA 311 may comprise suitable circuitry, logic, interface(s), and/or code that may be operable to amplify signals generated by the baseband/RF circuitry 301. The T/R switches 310 may be operable to sequentially couple the LNA 309 and the PA 311 to one of the antenna ports, such as 205F or 205G, for example, during a time slot. In this manner, RF signals may be transmitted and received in TDD mode.

The specific ports that the T/R switches 310 may couple to PAs and/or LNAs is not limited to the exemplary embodiment shown in FIG. 3B. Accordingly, the T/R switches 310 may be configured to couple multiple antenna ports 205A-205H to a PA or LNA, and vice versa.

In operation, the baseband/RF circuitry 301 may generate signals to be transmitted by the distributed antenna 201. The generated signals may be amplified by the PA 311 and communicated to the distributed antenna 201 via the T/R switches 310 that may be configured to couple the PA 311 to the appropriate antenna port, such as antenna port 205G, for example.

The T/R switches 310 may then switch the antenna port 205G to the LNA 309. An RF signal received by the distributed antenna 201 may then be communicated to the baseband/RF circuitry 301 via the T/R switches 310. In this manner, TDD mode communication may be enabled. Accordingly, the transmission of RF signals may occur for a defined amount of time, followed by the reception of RF signals for another defined amount of time via the same antenna port, where the amounts of time devoted to transmission versus reception may depend on the desired uplink versus downlink speed.

The gain of the LNA 309 and/or the output power of the PA 311 may be dynamically adjusted during operation depending on received signal strength or channel conditions, for example. In addition the TDD parameters may be adjusted to enable increased uplink or downlink speeds, for example.

Figure 4:
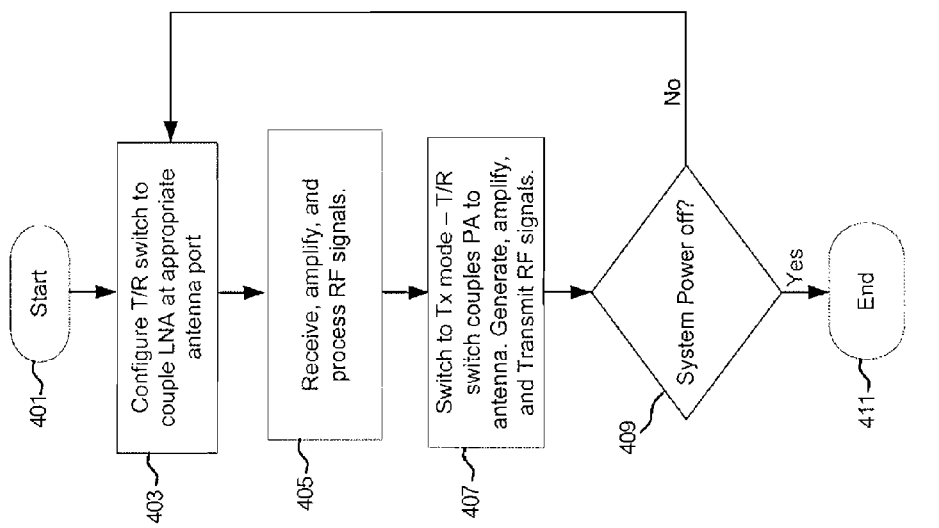
FIG. 4 is a block diagram illustrating exemplary steps for implementing a transmit/receive switch and a multipart distributed antenna, in accordance with an embodiment of the invention.

FIG. 4 is a block diagram illustrating exemplary steps for implementing a transmit/receive switch and a multiport distributed antenna, in accordance with an embodiment of the invention. Referring to FIG. 4, in step 403 after start step 401, the T/R switches 310 may be configured to couple the LNA 309 to an appropriate antenna port, such as the antenna port 205G. The appropriate port may be defined by the impedance of the port compared to the input impedance of the LNA to obtain impedance matching. In step 405, RF signals may be received by the distributed antenna, amplified by the LNA 309, and processed by the baseband/RF circuitry 301, followed by step 407, where the T/R switches 310 may couple the PA 311 to the antenna port 205G. RF signals to be transmitted may be generated by the baseband/RF circuitry 301, amplified by the PA 311, and communicated to the distributed antenna 201 via the T/R switches 310 and the antenna port 205G. If, in step 409, the wireless device 150 is to be powered down, the exemplary steps may proceed to end step 411, but if the wireless device 150 is not to be powered down, the exemplary steps may proceed back to step 403 to continue the TDD communication.

In an embodiment of the invention, a method and system are disclosed for selectively coupling one or more of a plurality of low noise amplifiers (LNAs) 303A-303H/309 and one or more of a plurality of power amplifiers (PAs) 303A-303H/311 to one or more of a plurality of ports of a multi-port distributed antenna 164/201 utilizing a configurable transmit/receive (T/R) switch 310 integrated on a chip 162 with the plurality of LNAs and PAs 303A-303H/309/311. The one or more of a plurality of LNAs and PAs 303A-303H/309/311 may be impedance matched to the multi-port distributed antenna 164/201 by coupling the one or more of a plurality of LNAs and PAs 303A-303H/309/311 to the one or more of a plurality of ports 205A-205H based on a characteristic impedance of the multi-port distributed antenna 164/201 at the one or more of a plurality of ports 205A-205H. The T/R switch 310, which may comprise CMOS switches, may be integrated on a package 167 to which the chip 162 may be bonded. The signals, which may comprise RF signals, transmitted and received by the multi-port distributed antenna 164/201 may be time division duplexed. The multi-port distributed antenna 164/201 may be integrated on a chip 162 with the LNAs and PAs 303A-303H/309/311, or integrated on a package 167 to which the chip 162 may be bonded. The multi-port distributed antenna 201 may comprise a microstrip antenna. The one or more of the plurality of LNAs 303A-303H/309 and the one or more of the plurality of PAs 303A-303H/311 may be coupled to different ports on the multi-port distributed antenna 201 via the T/R switch 310.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for an on-chip and/or on-package transmit/receive switch and antenna.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication in a wireless device, the method comprising:
   configuring one or more transmit/receive (T/R) switches in a package to selectively couple one or more of a plurality of low noise amplifiers (LNAs) and/or one or more of a plurality of power amplifiers (PAs) to one or more of a plurality of ports of a multi-port distributed antenna that are within or on said package.

2. The method of claim 1 comprising coupling said one or more of said plurality of LNAs to said one or more of said plurality of ports based on a characteristic impedance of said multi-port distributed antenna at said one or more of said plurality of ports.

3. The method of claim 1 comprising coupling said one or more of said plurality of PAs to said one or more of said plurality of ports based on a characteristic impedance of said multi-port distributed antenna at said one or more of said plurality of ports.

4. The method of claim 1, wherein said T/R switches comprise CMOS switches.

5. The method of claim 1 comprising time division duplexing signals transmitted and received by said multi-port distributed antenna.

6. The method of claim 1, wherein said multi-port distributed antenna comprises a microstrip antenna.

7. The method of claim 1 comprising coupling said one or more of said plurality of LNAs and said one or more of said plurality of PAs to different ports on said multi-port distributed antenna by said T/R switches.

8. A system for enabling communication in a wireless device, the system comprising:
   one or more transmit/receive (T/R) switches in a package;
   one or more circuits operable to selectively couple one or more of a plurality of low noise amplifiers (LNAs) and/or one or more of a plurality of power amplifiers (PAs) to one or more of a plurality of ports of a multi-port distributed antenna that are within or on said package.

9. The system of claim 8, wherein said one or more of said plurality of LNAs are coupled to said one or more of said plurality of ports based on a characteristic impedance of said multi-port distributed antenna at said one or more of said plurality of ports.

10. The system of claim 8, wherein said one or more of said plurality of PAs are coupled to said one or more of said plurality of ports based on a characteristic impedance of said multi-port distributed antenna at said one or more of said plurality of ports.

11. The system of claim 8, wherein said T/R switches comprise CMOS switches.

12. The system of claim 8, wherein time division duplexing signals transmitted and received by said multi-port distributed antenna.

13. The system of claim 8, wherein said multi-port distributed antenna comprises a microstrip antenna.

14. The system of claim 8, wherein said one or more of said plurality of LNAs and said one or more of said plurality of PAs are coupled to different ports on said multi-port distributed antenna by said T/R switches.

* * * * *